(12) United States Patent
Adetola et al.

(10) Patent No.: US 11,085,782 B2
(45) Date of Patent: Aug. 10, 2021

(54) INTERACTIVE TRIP-PLANNING APPLICATION FOR TRANSPORTATION REFRIGERATION UNIT WITH AN ENERGY STORAGE DEVICE

(71) Applicant: CARRIER CORPORATION, Palm Beach Gardens, FL (US)

(72) Inventors: Veronica Adetola, West Hartford, CT (US); Craig R. Walker, South Glastonbury, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 102 days.

(21) Appl. No.: 16/292,721

(22) Filed: Mar. 5, 2019

(65) Prior Publication Data

US 2019/0277647 A1   Sep. 12, 2019

Related U.S. Application Data

(60) Provisional application No. 62/639,218, filed on Mar. 6, 2018.

(51) Int. Cl.
*G01C 21/34* (2006.01)
*B60H 1/00* (2006.01)
(Continued)

(52) U.S. Cl.
CPC ..... *G01C 21/3469* (2013.01); *B60H 1/00428* (2013.01); *B60H 1/00771* (2013.01);
(Continued)

(58) Field of Classification Search
USPC ......................................................... 701/410
See application file for complete search history.

(56) References Cited

U.S. PATENT DOCUMENTS 8,612,140 B2   12/2013   Gutman
8,849,499 B2 *  9/2014   Profitt-Brown ........ B60K 35/00
                                                            701/31.4
(Continued)

FOREIGN PATENT DOCUMENTS

CN   105159183 A    12/2015
WO   2017205961 A1  12/2017
WO   2018017818 A1   1/2018

OTHER PUBLICATIONS

Gambuti, R. et al., "Electric Vehicle Trip Planning Integrating Range Constraints And Charging Facilities", Control and Automation (MED), 2015 23th Mediterranean Conference on Control and Automation, Jun. 16-19, 2015.
(Continued)

*Primary Examiner* — Tyler D Paige
(74) *Attorney, Agent, or Firm* — Cantor Colburn LLP (57) ABSTRACT

A method of determining potential routes for a transportation refrigeration unit (TRU) powered by an electric energy storage device is provided. The method comprising: storing container parameters of a container to store perishable goods, TRU parameters of the TRU to control environment conditions within container, and perishable good requirements for transporting the perishable goods within the container; receiving route parameters, weather parameters, and perishable good parameters; determining one or more potential routes in response to the route parameters; determining a TRU predicted operation along each of the one or more potential routes in response to at least one of the route parameters, container parameters, TRU parameters, weather parameters, perishable good parameters, and perishable good requirements; and determining a predicted energy consumption from the energy storage device by the TRU along each of the one or more potential routes in response to
(Continued)

the TRU predicted operation and energy storage device parameters.

22 Claims, 6 Drawing Sheets

(51) Int. Cl.
*G06Q 10/04* (2012.01)
*B60H 1/32* (2006.01)
*G01R 31/392* (2019.01)
*G01R 31/382* (2019.01)
*B60K 35/00* (2006.01)
*B60P 3/20* (2006.01)
*G06Q 10/08* (2012.01)

(52) U.S. Cl.
CPC .......... *B60H 1/3232* (2013.01); *B60K 35/00* (2013.01); *B60P 3/20* (2013.01); *G01C 21/3415* (2013.01); *G01C 21/3453* (2013.01); *G01R 31/382* (2019.01); *G01R 31/392* (2019.01); *G06Q 10/047* (2013.01); *G06Q 10/0832* (2013.01); *B60K 2370/155* (2019.05)

(56) References Cited

U.S. PATENT DOCUMENTS

| | | | |
|---|---|---|---|
| 9,476,725 B2 | 10/2016 | Fisher et al. | |
| 9,650,042 B2 | 5/2017 | Sujan et al. | |
| 9,689,681 B2 | 6/2017 | Napolitano et al. | |
| 9,702,715 B2 | 7/2017 | Cooper et al. | |
| 9,739,624 B2* | 8/2017 | Rajagopalan | B60L 53/68 |
| 2011/0225105 A1 | 9/2011 | Scholer et al. | |
| 2013/0033381 A1* | 2/2013 | Breed | B60T 7/16 |
| | | | 340/568.1 |
| 2013/0036068 A1* | 2/2013 | Smith | G06Q 10/083 |
| | | | 705/332 |
| 2013/0046457 A1* | 2/2013 | Pettersson | B60L 1/14 |
| | | | 701/117 |
| 2014/0026599 A1* | 1/2014 | Rusignuolo | F25B 49/025 |
| | | | 62/56 |
| 2015/0039215 A1 | 2/2015 | Wu et al. | |
| 2015/0112526 A1 | 4/2015 | Martin et al. | |
| 2015/0188323 A1* | 7/2015 | Muralidhar | H02J 7/007 |
| | | | 62/230 |
| 2015/0246593 A1* | 9/2015 | Larson | B60H 1/00364 |
| | | | 62/56 |
| 2017/0282736 A1 | 10/2017 | Goei | |
| 2018/0001739 A1* | 1/2018 | Vehr | F25B 49/02 |
| 2018/0001744 A1* | 1/2018 | Vehr | B60H 1/00428 |
| 2019/0126903 A1* | 5/2019 | Mizutani | B60L 58/10 |
| 2019/0242716 A1* | 8/2019 | N | G06Q 10/08355 |
| 2019/0277647 A1* | 9/2019 | Adetola | B60H 1/00771 |
| 2020/0309440 A1* | 10/2020 | Poolman | B60H 1/3232 |

OTHER PUBLICATIONS

J. Ferreira et al., "Dynamic Range Prediction For An Electric Vehicle", Electric Vehicle Symposium and Exhibition (EVS27), 2013 World, Nov. 17-20, 2013.

The Extended European Search for Application No. 19160875.1-1009; Report Issued Date: Jul. 29, 2019; Report Received Date: Aug. 6, 2019; 11 pages.

* cited by examiner

INTERACTIVE TRIP-PLANNING APPLICATION FOR TRANSPORTATION REFRIGERATION UNIT WITH AN ENERGY STORAGE DEVICE

CROSS-REFERENCE TO RELATED APPLICATIONS

This application claims the benefit of U.S. Provisional Application No. 62/639,218 filed Mar. 6, 2018, which is incorporated herein by reference in its entirety.

BACKGROUND

The subject matter disclosed herein generally relates to transportation refrigeration units, and more specifically to an apparatus and a method for determining potential routes to transport perishable goods with a transportation refrigeration unit powered by an energy storage device and service range of the energy storage device.

Traditional refrigerated cargo trucks or refrigerated tractor trailers, such as those utilized to transport cargo via sea, rail, or road, is a truck, trailer or cargo container, generally defining a cargo compartment, and modified to include a refrigeration system located at one end of the truck, trailer, or cargo container. Refrigeration systems typically include a compressor, a condenser, an expansion valve, and an evaporator serially connected by refrigerant lines in a closed refrigerant circuit in accord with known refrigerant vapor compression cycles. A power unit, such as a combustion engine, drives the compressor of the refrigeration unit, and may be diesel powered, natural gas powered, or other type of engine. In many tractor trailer transport refrigeration systems, the compressor is driven by the engine shaft either through a belt drive or by a mechanical shaft-to-shaft link. In other systems, the engine of the refrigeration unit drives a generator that generates electrical power, which in-turn drives the compressor.

In conventional systems, the trip route for a transport refrigeration systems are determined by a navigation system and the shortest or fastest route is being chosen. The shortest or fastest route is not always the most energy efficient route for the refrigerated trucks.

Tighter requirements for today's truck/trailer refrigeration system to keep their loads at ideal temperatures and humidity levels necessitate the use of well-orchestrated delivery plan and execution. Any interruption in the TRU service due to unavailability of power to run the unit will be costly and impact the cargo safety, quality and integrity.

With current environmental trends, improvements in transport refrigeration units are desirable particularly toward aspects of environmental impact. With environmentally friendly refrigeration units, improvements in reliability, cost, and weight reduction are also desirable.

BRIEF SUMMARY

According to one embodiment, a method of determining potential routes for a transportation refrigeration unit (TRU) powered by an electric energy storage device is provided. The method comprising: storing container parameters of a container to store perishable goods, TRU parameters of the TRU to control environment conditions within the container, and perishable good requirements for transporting the perishable goods within the container; receiving route parameters, weather parameters, and perishable good parameters; determining one or more potential routes in response to the route parameters; determining a TRU predicted operation along each of the one or more potential routes in response to at least one of the route parameters, the container parameters, the TRU parameters, the weather parameters, the perishable good parameters, and the perishable good requirements; and determining a predicted energy consumption from the energy storage device by the TRU along each of the one or more potential routes in response to the TRU predicted operation and the energy storage device parameters.

In addition to one or more of the features described above, or as an alternative, further embodiments may include displaying each of the one or more potential routes and the predicted energy consumption from the energy storage device by the TRU for each of the one or more potential routes on a mobile computing device.

In addition to one or more of the features described above, or as an alternative, further embodiments may include that the energy storage device includes a battery system.

In addition to one or more of the features described above, or as an alternative, further embodiments may include that the energy storage device parameters include at least one of a state of charge of the battery system, a state of health of the battery system and a battery remaining discharge time period.

In addition to one or more of the features described above, or as an alternative, further embodiments may include: determining predicted energy device storage parameters along each of the one or more potential routes in response to the TRU predicted operation and the energy storage device parameters; and displaying the predicted energy device storage parameters along each of the one or more potential routes on a mobile computing device.

In addition to one or more of the features described above, or as an alternative, further embodiments may include: activating an alarm on a mobile computing device when a predicted energy consumption from the energy storage device by the TRU exceeds predicted energy device storage parameters along one of the one or more potential routes.

In addition to one or more of the features described above, or as an alternative, further embodiments may include: determining a battery remaining discharge time period in response to the predicted energy consumption; and determining whether the battery remaining discharge time period is longer than at least one of the one or more potential routes.

In addition to one or more of the features described above, or as an alternative, further embodiments may include: displaying each of the one or more potential routes and battery charging locations along each of the one or more potential routes on at least one of a mobile computing device and a display interface on the controller of the TRU.

According to another embodiment, an engineless transport refrigeration unit (TRU) is provided. The engineless TRU comprising: a compressor constructed and arranged to compress a refrigerant; a compressor motor configured to drive the compressor and operate at a voltage range of two hundred to six hundred volts; an electric energy storage device for providing power to the compressor motor; and a controller configured to control operation of the transport refrigeration unit. The controller comprising: a processor; and a memory comprising computer-executable instructions that, when executed by the processor, cause the processor to perform operations. The operations comprising: storing container parameters of a container to store perishable goods, TRU parameters of the TRU to control environment conditions within the container, and perishable good requirements for transporting the perishable goods within the container;

receiving route parameters, weather parameters, and perishable good parameters; determining one or more potential routes in response to the route parameters; determining a TRU predicted operation along each of the one or more potential routes in response to at least one of the route parameters, the container parameters, the TRU parameters, the weather parameters, the perishable good parameters, and the perishable good requirements; and determining a predicted energy consumption from the energy storage device by the TRU along each of the one or more potential routes in response to the TRU predicted operation and the energy storage device parameters.

In addition to one or more of the features described above, or as an alternative, further embodiments may include that the operations further comprise: displaying each of the one or more potential routes and the predicted energy consumption from the energy storage device by the TRU for each of the one or more potential routes on a mobile computing device.

In addition to one or more of the features described above, or as an alternative, further embodiments may include that the energy storage device includes a battery system.

In addition to one or more of the features described above, or as an alternative, further embodiments may include that the energy storage device parameters include at least one of a state of charge of the battery system, a state of health of the battery system, and a battery remaining discharge time period.

In addition to one or more of the features described above, or as an alternative, further embodiments may include that the operations further comprise: determining predicted energy device storage parameters along each of the one or more potential routes in response to the TRU predicted operation and the energy storage device parameters; and displaying the predicted energy device storage parameters along each of the one or more potential routes on a mobile computing device.

In addition to one or more of the features described above, or as an alternative, further embodiments may include that the operations further comprise: activating an alarm on a mobile computing device when a predicted energy consumption from the energy storage device by the TRU exceeds predicted energy device storage parameters along one of the one or more potential routes.

In addition to one or more of the features described above, or as an alternative, further embodiments may include that the operations further comprise: determining a battery remaining discharge time period in response to the predicted energy consumption; and determining whether the battery remaining discharge time period is longer than at least one of the one or more potential routes.

In addition to one or more of the features described above, or as an alternative, further embodiments may include that the operations further comprise: displaying each of the one or more potential routes and battery charging locations along each of the one or more potential routes on at least one of a mobile computing device and a display interface on the controller of the TRU.

According to another embodiment, a system for determining potential routes for a transportation refrigeration unit (TRU) powered by an electric energy storage device is provided. The system comprising: a transportation refrigeration unit comprising: a compressor constructed and arranged to compress a refrigerant; a compressor motor configured to drive the compressor and operate at a voltage range of two hundred to six hundred volts; an electric energy storage device for providing power to the compressor motor; and a controller configured to control operation of the transport refrigeration unit; and a trip planning engine in electronic communication with the controller through a cloud network, the trip planning engine comprising: a processor; and a memory comprising computer-executable instructions that, when executed by the processor, cause the processor to perform operations, the operations comprising: storing container parameters of a container to store perishable goods, TRU parameters of the TRU to control environment conditions within the container, and perishable good requirements for transporting the perishable goods within the container; receiving route parameters, weather parameters, and perishable good parameters; determining one or more potential routes in response to the route parameters; determining a TRU predicted operation along each of the one or more potential routes in response to at least one of the route parameters, the container parameters, the TRU parameters, the weather parameters, the perishable good parameters, and the perishable good requirements; and determining a predicted energy consumption from the energy storage device by the TRU along each of the one or more potential routes in response to the TRU predicted operation and the energy storage device parameters.

In addition to one or more of the features described above, or as an alternative, further embodiments may include that the operations further comprise: displaying each of the one or more potential routes and the predicted energy consumption from the energy storage device by the TRU for each of the one or more potential routes on a mobile computing device.

In addition to one or more of the features described above, or as an alternative, further embodiments may include that the energy storage device includes a battery system.

In addition to one or more of the features described above, or as an alternative, further embodiments may include that the energy storage device parameters include at least one of a state of charge of the battery system, a state of health of the battery system, and a battery remaining discharge time period.

Technical effects of embodiments of the present disclosure include determining potential routes for a transportation refrigeration unit with an energy storage device and analyzing each route based on predicted energy consumption of the transportation refrigeration unit.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION

The subject matter which is regarded as the disclosure is particularly pointed out and distinctly claimed in the claims at the conclusion of the specification. The foregoing and other features and advantages of the disclosure are apparent from the following detailed description taken in conjunction with the accompanying drawings in which:

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
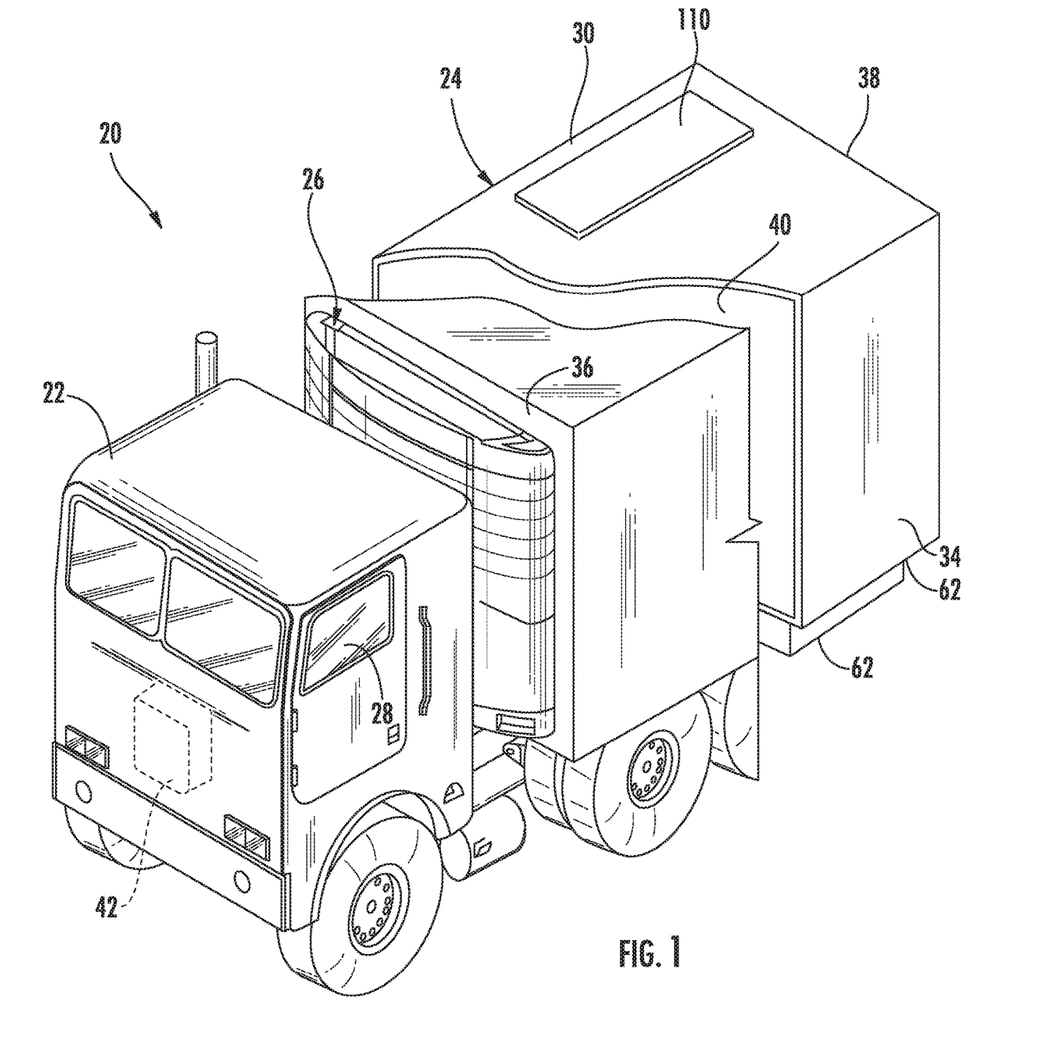
FIG. 1 is a perspective view of a transport refrigeration system having an engineless transport refrigeration unit as one, non-limiting, according to an embodiment of the present disclosure.

Referring to FIG. 1, a transport refrigeration system 20 of the present disclosure is illustrated. In the illustrated embodiment, the transport refrigeration systems 20 may include a tractor or vehicle 22, a container 24, and an engineless transport refrigeration unit 26. The container 24 may be pulled by a vehicle 22, such as, for example, a trailer. It is understood that embodiments described herein may be applied to shipping containers that are shipped by rail, sea, air, or any other suitable container, thus the vehicle may be a truck, tractor trailer system, train, boat, airplane, helicopter . . . etc.

The vehicle 22 may include an operator's compartment or cab 28 and a combustion engine 42 which is part of the powertrain or drive system of the vehicle 22. The container 24 may be coupled to the vehicle 22 and is thus pulled or propelled to desired destinations. The container 24 may be configured as a trailer of a tractor trailer trucking system. The container 24 may include a top wall 30, a bottom wall 32 opposed to and spaced from the top wall 30, two side walls 34 spaced from and opposed to one-another, and opposing front and rear walls 36, 38 with the front wall 36 being closest to the vehicle 22. The container 24 may further include doors (not shown) at the rear wall 38, or any other wall. The walls 30, 32, 34, 36, 38 together define the boundaries of a cargo compartment 40. Typically, transport refrigeration systems 20 are used to transport and distribute cargo, such as, for example perishable goods and environmentally sensitive goods (herein referred to as perishable goods). The perishable goods may include but are not limited to fruits, vegetables, grains, beans, nuts, eggs, dairy, seed, flowers, meat, poultry, fish, ice, blood, pharmaceuticals, or any other suitable cargo requiring cold chain transport. In the illustrated embodiment, the transport refrigeration unit 26 is associated with a container 24 to provide desired environmental parameters, such as, for example temperature, pressure, humidity, carbon dioxide, ethylene, ozone, light exposure, vibration exposure, and other conditions to the cargo compartment 40. In further embodiments, the transport refrigeration unit 26 is a refrigeration system capable of providing a desired temperature and humidity range.

Figure 2:
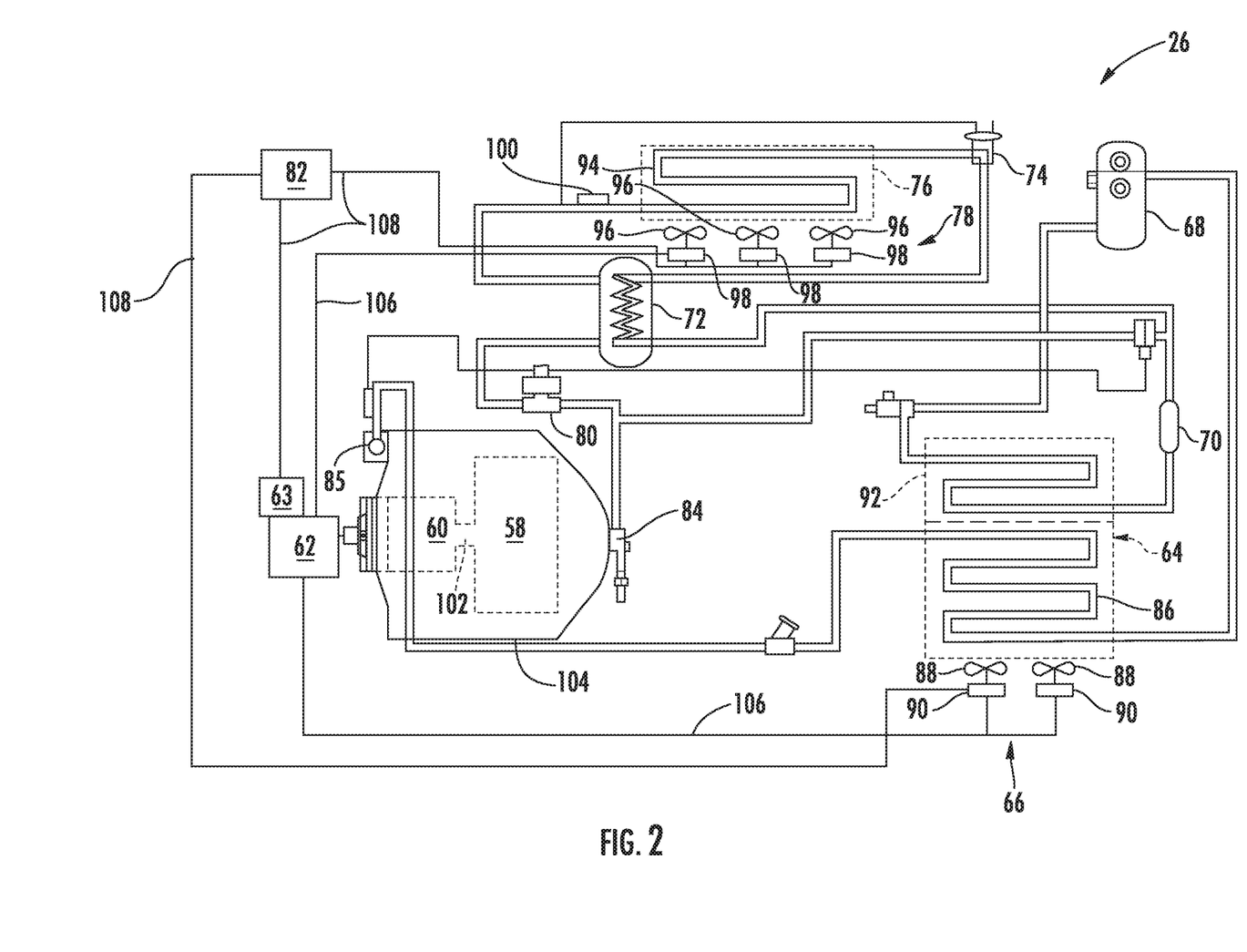
FIG. 2 is a schematic of the engineless transport refrigeration unit, according to an embodiment of the present disclosure.

Referring to FIGS. 1 and 2, the container 24 is generally constructed to store a cargo (not shown) in the compartment 40. The engineless transport refrigeration unit 26 is generally integrated into the container 24 and may be mounted to the front wall 36. The cargo is maintained at a desired temperature by cooling of the compartment 40 via the refrigeration unit 26 that circulates airflow into and through the cargo compartment 40 of the container 24. It is further contemplated and understood that the refrigeration unit 26 may be applied to any transport compartments (e.g. shipping or transport containers) and not necessarily those used in tractor trailer systems. Furthermore, the transport container may be a part of the of the vehicle 22 or constructed to be removed from a framework and wheels (not shown) of the container 24 for alternative shipping means (e.g., marine, railroad, flight, and others).

The components of the engineless transport refrigeration unit 26 may include a compressor 58, an electric compressor motor 60, an electric energy storage device 62, a condenser 64 that may be air cooled, a condenser fan assembly 66, a receiver 68, a filter dryer 70, a heat exchanger 72, a thermostatic expansion valve 74, an evaporator 76, an evaporator fan assembly 78, a suction modulation valve 80, and a controller 82 that may include a computer-based processor (e.g., microprocessor). Operation of the engineless transport refrigeration unit 26 may best be understood by starting at the compressor 58, where the suction gas (i.e., natural refrigerant) enters the compressor at a suction port 84 and is compressed to a higher temperature and pressure. The refrigerant gas is emitted from the compressor at an outlet port 86 and may then flow into tube(s) 86 of the condenser 64.

Air flowing across a plurality of condenser coil fins (not shown) and the tubes 86, cools the gas to its saturation temperature. The air flow across the condenser 64 may be facilitated by one or more fans 88 of the condenser fan assembly 66. The condenser fans 88 may be driven by respective condenser fan motors 90 of the fan assembly 66 that may be electric.

By removing latent heat, the gas within the tubes 86 condenses to a high pressure and high temperature liquid and flows to the receiver 68 that provides storage for excess liquid refrigerant during low temperature operation. From the receiver 68, the liquid refrigerant may pass through a sub-cooler heat exchanger 92 of the condenser 64, through the filter-dryer 70 that keeps the refrigerant clean and dry, then to the heat exchanger 72 that increases the refrigerant sub-cooling, and finally to the thermostatic expansion valve 74.

As the liquid refrigerant passes through the orifices of the expansion valve 74, some of the liquid vaporizes into a gas (i.e., flash gas). Return air from the refrigerated space (i.e., cargo compartment 40) flows over the heat transfer surface of the evaporator 76. As the refrigerant flows through a plurality of tubes 94 of the evaporator 76, the remaining liquid refrigerant absorbs heat from the return air, and in so doing, is vaporized.

The evaporator fan assembly 78 includes one or more evaporator fans 96 that may be driven by respective fan motors 98 that may be electric. The air flow across the evaporator 76 is facilitated by the evaporator fans 96. From the evaporator 76, the refrigerant, in vapor form, may then flow through the suction modulation valve 80, and back to the compressor 58. A thermostatic expansion valve bulb sensor 100 may be located proximate to an outlet of the evaporator tube 94. The bulb sensor 100 is intended to control the thermostatic expansion valve 74, thereby controlling refrigerant superheat at an outlet of the evaporator tube 94. It is further contemplated and understood that the above generally describes a single stage vapor compression system that may be used for natural refrigerants such as propane and ammonia. Other refrigerant systems may also be applied that use carbon dioxide (CO2) refrigerant, and that may be a two-stage vapor compression system.

A bypass valve (not shown) may facilitate the flash gas of the refrigerant to bypass the evaporator 76. This will allow the evaporator coil to be filled with liquid and completely 'wetted' to improve heat transfer efficiency. With $CO_2$ refrigerant, this bypass flash gas may be re-introduced into a mid-stage of a two-stage compressor.

The compressor 58 and the compressor motor 60 may be linked via an interconnecting drive shaft 102. The compressor 58, the compressor motor 60 and the drive shaft 102 may all be sealed within a common housing 104. The compressor 58 may be a single compressor. The single compressor may be a two-stage compressor, a scroll-type compressor or other compressors adapted to compress natural refrigerants. The natural refrigerant may be $CO_2$, propane, ammonia, or any other natural refrigerant that may include a global-warming potential (GWP) of about one (1).

Figure 3:
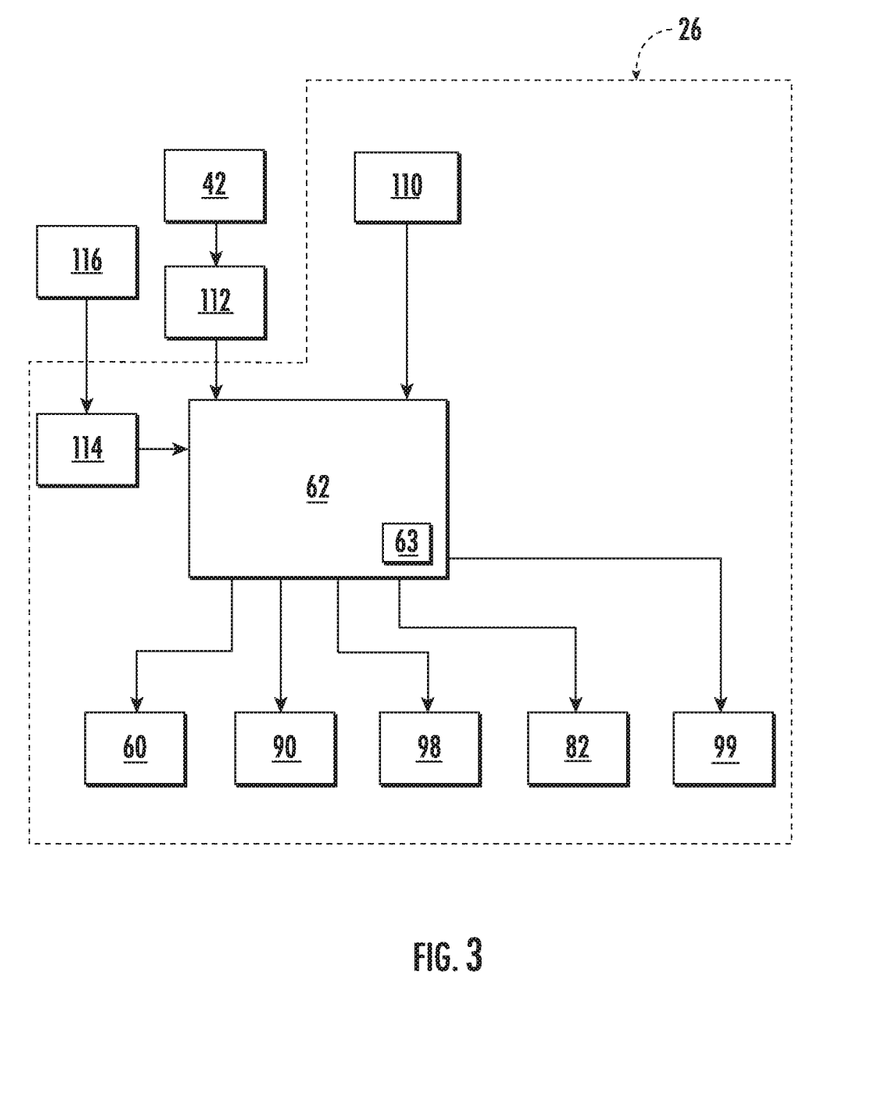
FIG. 3 is a block diagram of an energy storage device of the engineless transport refrigeration unit and sources of power recharge, according to an embodiment of the present disclosure.

Referring to FIGS. 2 and 3, the energy storage device 62 may be configured to selectively power the compressor motor 60, the condenser fan motors 90, the evaporator fan motors 98, the controller 82, and other components 99 (see FIG. 3) that may include various solenoids and/or sensors) via, for example, electrical conductors 106. The controller 82 through a series of data and command signals over various pathways 108 may, for example, control the electric motors 60, 90, 98 as dictated by the cooling needs of the refrigeration unit 26. In one embodiment, the energy storage device 62 may be secured to the underside of the bottom wall 32 of the container 24 (see FIG. 1). The operation of the energy storage device 62 may be managed and monitored by an energy storage management system 63. The energy management system 63 is configured to determine a status of charge of the energy storage device 62 and a state of health of the energy storage device 62. Examples of the energy storage device 62 may include a battery system (e.g. a battery or bank of batteries), fuel cells, and others capable of storing and outputting electric energy that may be direct current (DC).

The engineless transport refrigeration unit 26 may include a DC architecture without any of the components requiring alternate current (AC), or a mechanical form of power, to operate (i.e., the motors 60, 90, 98 may be DC motors). If the energy storage device 62 includes a battery system, the battery system may have a voltage potential within a range of about two-hundred volts (200V) to about six-hundred volts (600V). The use of these batteries may include a step-up or step-down transformer as needed (not shown). Generally, the higher the voltage, the greater is the sustainability of electric power which is preferred. However, the higher the voltage, the greater is the size and weight of, for example, the compressor motor 60 which is not preferred when transporting cargo.

The engineless transport refrigeration unit 26 may further include a renewable power source 110 configured to recharge the batteries of the energy storage device 62. One embodiment of a renewable power source 110 may be solar panels mounted, for example, to the outside of the top wall 30 of the container 24 (also see FIG. 1). Another embodiment of a renewable power source 110 may include a regenerative braking system that derives electric power from the braking action of the wheels of the transport refrigeration system 20.

The combustion engine 42 of the vehicle 22 may further include an alternator or generator 112 for recharging the batteries 62. Alternatively or in addition to, the engineless transport refrigeration unit 26 may include a rectifier 114 and other components that facilitate recharging of the batteries 62 from an alternating current source 116 such as, for example, a remote power station or receptacle that receives power from a public utility grid.

Benefits of the present disclosure when compared to more traditional systems include lower fuel consumption, and a refrigeration unit that emits less noise and is lighter in weight. Yet further, the present disclosure includes an energy storage device that is conveniently and efficiently recharged to meet the power demands of the refrigeration unit.

Figure 4:
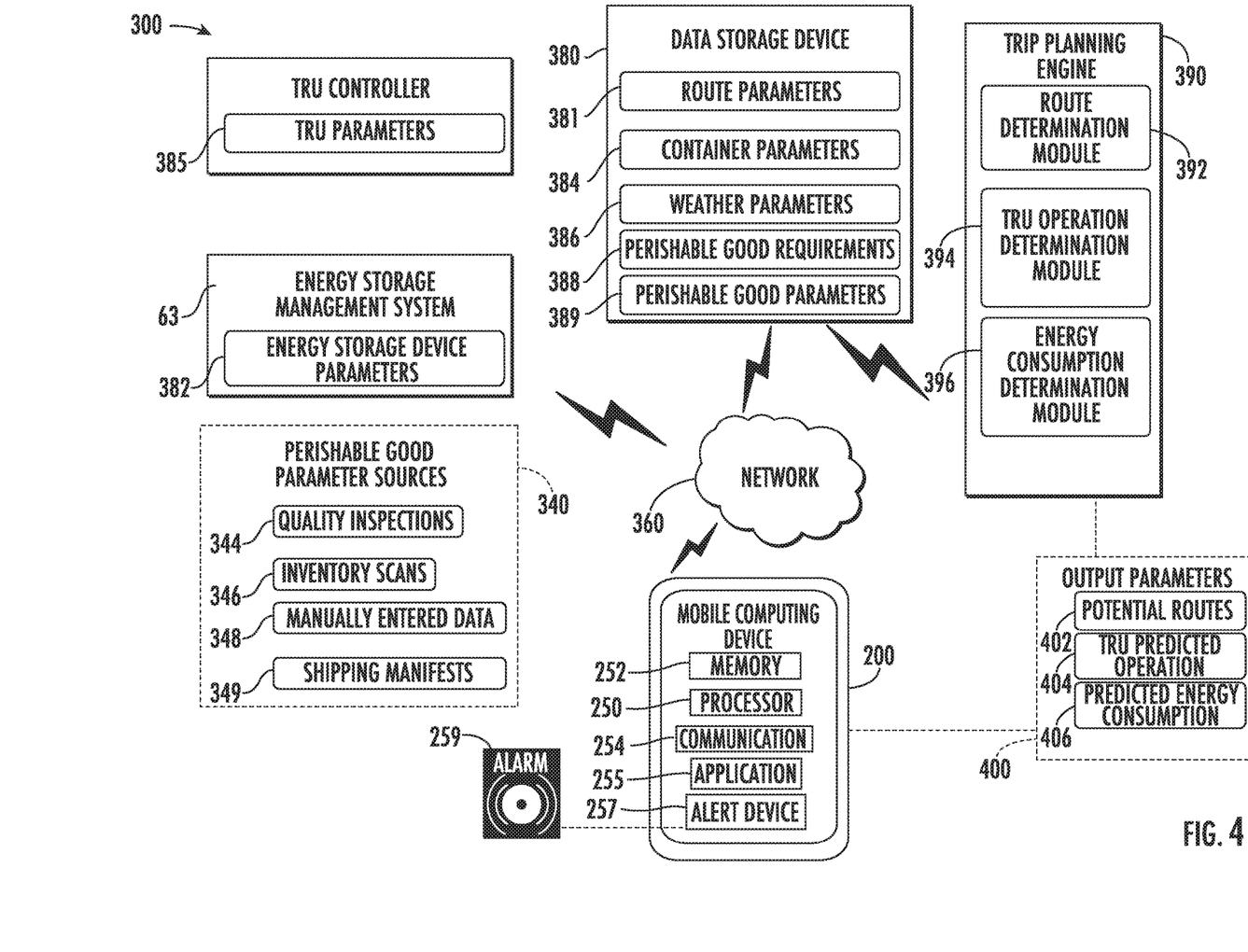
FIG. 4 illustrates a schematic view of a system for determining potential routes for transportation of perishable goods, according to an embodiment of the present disclosure.
Figure 5:
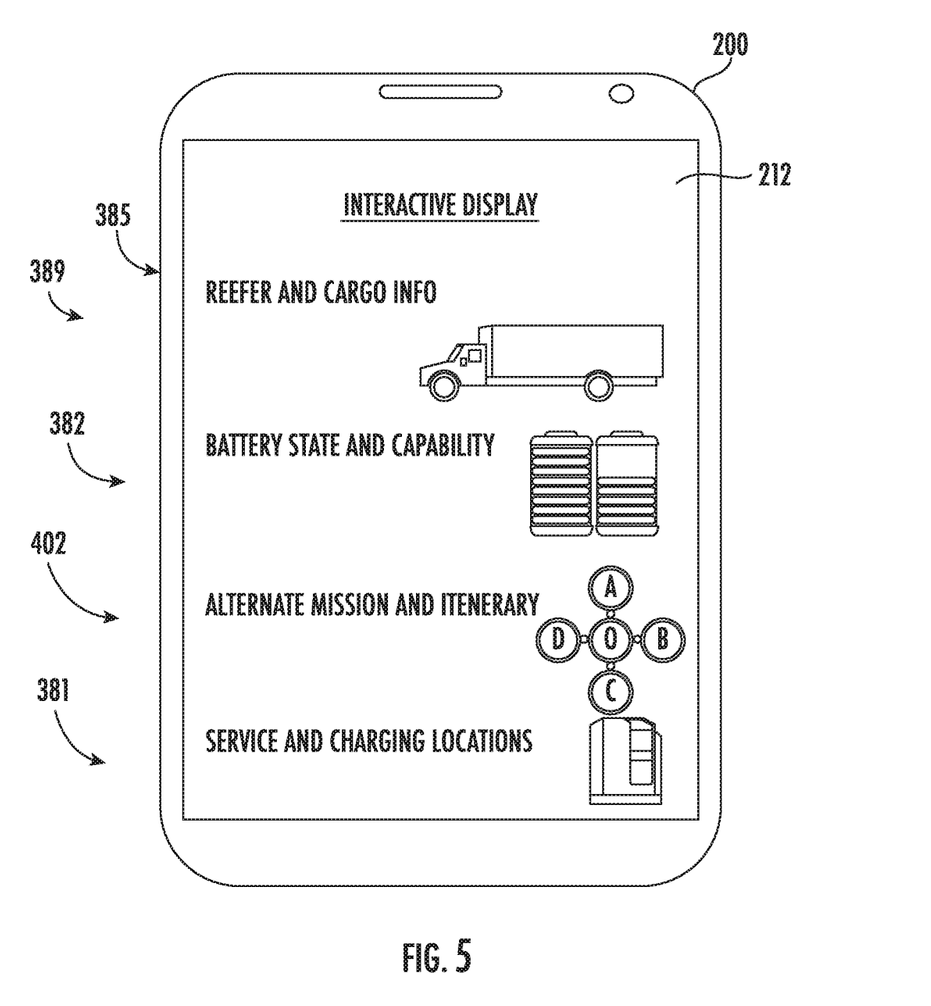
FIG. 5 illustrates a schematic view of a user device that displays potential routes, according to an embodiment of the present disclosure.

Referring now to FIGS. 4 and 5 with continued reference to FIGS. 1-3. FIG. 4 illustrates a trip planning system 300 for a transportation refrigeration system 20 having an engineless transportation refrigeration unit (TRU) 26. The trip planning system 300 includes a trip planning engine 390. The trip planning engine 390 may be installed on a controller 82 of the TRU 26 and/or dedicated hardware (e.g. server) in electronic communication with the controller 82 through a cloud computing network 360.

The trip planning engine 390 is in electronic communication with a mobile computing device 200. The mobile computing device 200 may include a processor 250, memory 252, and communication module 254, as shown in FIG. 4. The processor 250 can be any type or combination of computer processors, such as a microprocessor, microcontroller, digital signal processor, application specific integrated circuit, programmable logic device, and/or field programmable gate array. The memory 252 is an example of a non-transitory computer readable storage medium tangibly embodied in the mobile computing device 200 including executable instructions stored therein, for instance, as firmware. The communication module 254 may implement one or more wireless communication protocols. The mobile computing device 200 may include an alert device 257 configured to activate an alarm 259. In three non-limiting examples, the alert device 257 may be a vibration motor, audio speaker, and/or display screen. The alarm 259 may be audible, visual, haptic, and/or vibratory. The mobile computing device 200 may also include an application 255. Embodiments disclosed herein, may operate through the application 255 installed on the mobile computing device 200.

In the illustrated embodiment, the trip planning engine 390 may include and/or be operably connected to a data storage device 380 to store the perishable good parameters 389, perishable good requirements 388, route parameters 381, container parameters, 386, weather parameters 386, TRU parameters 385, and energy storage device parameters 382. The data storage device 380 is connected to the various data sources through the network 360. The data storage device 380 may be but is not limited to a random access memory (RAM), read only memory (ROM), or other electronic, optical, magnetic or any other computer readable medium. Some parameters may be transmitted through the network 360 to the data storage device 380 including but not limited to route parameters 381, weather parameters 386, TRU parameters 385, energy storage device parameters 382, and perishable good parameters 389.

Perishable good parameters 389 of perishable goods located within the container 24 will determine perishable good requirements 388, which set the environmental conditions that the TRU 26 needs to provide within the cargo compartment 40. Perishable good parameters 389 of the perishable goods may be collected and stored in a data storage device 380. Perishable good parameters 389 may include attributes of the perishable goods such as, for example, perishable good type, temperature, weight, size, sugar content, maturity, grade, ripeness, labeling, and packaging. For instance, strawberries may be packaged in 1 pound clamshells, be a certain weight or grade, be organic, and have certain packaging or labels on the clamshells. This information specific to the perishable goods may be used to help determine the environmental conditions that the TRU 26 needs to provide within the cargo compartment 40. The perishable good parameters 389 may further be augmented with time, location stamps or other relevant information.

Perishable good parameters 389 may be provided by various perishable good parameter sources 340 including but not limited to quality inspections 344, inventory scans 346, manually entered data 348, and shipping manifests 349. Quality inspections 344 may reveal perishable good parameters 389 of the perishable goods, which may affect environmental conditions that the TRU 26 needs to provide within the cargo compartment 40. For instance, a particular batch of fruit may be at peak ripeness at the time it is loaded into the container 24, thus the fruit must be kept frozen to make it to the final destination still fresh. Quality inspections 344 may be done by a machine or a human being. Quality inspections 344 performed by a machine may be accomplished using a variety of techniques including but not limited to optical, odor, soundwave, infrared, or physical probe. Inventory scans 346 may also reveal perishable good parameters 389 about the perishable goods and may help in tracking what perishable goods are going to be shipped in the container 24. For instance, the inventory scan 346 may reveal the type, time, day, and the container 24 that will ship the perishable goods. The manually entered data 348 may be input by the mobile computing device 200 or via a variety of additional devices including but not limited to a cellular phone, tablet, laptop, smartwatch, a desktop computer or any other similar data input device known to one of skill in the art. A network 360 may be connected to a system containing shipping manifests 349 for the perishable goods to be transported. Each shipping manifest 349 may contain perishable good parameters 389 for the perishable goods.

Route parameters 381 may include a start location and a destination location. The start location may be a pick-up location for the perishable goods and the destination location may be a delivery location of the perishable goods. The route parameters 381 may also include real-time traffic information, re-charging locations and type of charging device (fast or slow charging) along various routes between the start location and the destination location. The re-charging locations include location to re-charge the electric energy storage device 62, such as, for example an electric battery charging station. Route parameters 381 may also include information regarding traffic conditions along the potential routes of the vehicle 22.

Container parameters 384 may include insulation capabilities (e.g. R-value) of the container 24 and the solar reflectance index (e.g. solar gain) of the container 24. For example, a TRU 26 may not have to work as hard to keep perishable goods cool in a container 24 with a higher R-value, thus reducing energy consumption of the energy storage device 62 to operate the TRU 26.

The TRU parameters 385 includes energy consumption rates of the TRU 26. The TRU parameters 385 may be affected by elevation along a route and/or weather conditions along a route. For example, a battery powered TRU 26 may see reduced efficiency in colder conditions. In another example, a solar powered TRU 26 may see reduced efficiency in cloudy weather. The weather parameters 386 include weather conditions that may be experienced between the start location and the destination location, including but not limited to temperature, barometric pressure, wind speed, wind direction, sunlight, cloud cover, storm warnings, humidity, ozone levels, and precipitation. In one example, extreme amounts of sunlight due to sunny weather may result in increased solar gain on the container 24, thus forcing the TRU 26 to work at an accelerated rate to keep the perishable goods cool. The weather parameters 386 may be obtained from an external online data base (e.g. AccuWeather, weather.org . . . etc.). The external online database may provide current and future weather information along all possible routes between a start location and a destination location. As mentioned above, the perishable good requirements 388 will dictate the environmental conditions that the TRU 26 needs to maintain within the container 24 in response to the perishable good parameters 389. The perishable good requirements 388 may be requirements for handling and/or packaging the perishable goods such as, for example government regulations or industry standards. For instance, the perishable good requirements 388 may dictate that eggs need to be kept at forty degrees Fahrenheit and stored in recycled cardboard egg crate containers.

In the illustrated embodiment, the trip planning system 300 further includes a trip planning engine 390. The trip planning engine 390 is also coupled to the data storage device 380. As shown, the trip planning engine 390 includes a route determination module 392, a TRU operation determination module 394, and an energy consumption determination module 396. The trip planning engine 390 may also include a processor (not shown) and an associated memory (not shown). The associated memory may be the data storage device 380. The processor may be but is not limited to a single-processor or multi-processor system of any of a wide array of possible architectures, including field programmable gate array (FPGA), central processing unit (CPU), application specific integrated circuits (ASIC), digital signal processor (DSP) or graphics processing unit (GPU) hardware arranged homogenously or heterogeneously. The memory may be but is not limited to a random access memory (RAM), read only memory (ROM), or other electronic, optical, magnetic or any other computer readable medium. The route determination module 392, the TRU operation determination module 394, and an energy consumption determination module 396 may be implemented in software as applications executed by the processor of trip planning engine 390.

The route determination module 392 determines one or more potential routes 402 for the perishable goods in response to at least one of the route parameters 381. The potential routes 402 determined by the route determination module 392 are transmitted to the TRU operation determination module 394. The TRU operation determination module 394 determines TRU predicted operation 404 along each of the one or more potential routes 402 in response to at least one of the route parameters 381, the container parameters 384, the TRU parameters 385, the weather parameters 386, the perishable good parameters 389, and the perishable good requirements 388.

The energy consumption determination module 396 determines predicted energy consumption 406 from the energy storage 62 by the TRU 26 along each of the one or more potential routes 402 in response to the TRU predicted operation 404 and the energy storage device parameters 382. The energy consumption determination module 396 is also configured to determine if the available charge (i.e. energy) in the storage device 62 is sufficient to complete the delivery mission (i.e. safely transport the perishable goods from a start location to a stop location) based on the predicted energy consumption 406. If the predicted energy consumption 406 indicates that the available charge in the energy storage device 62 is insufficient to complete the delivery mission then an alarm 259 may be activated.

Output parameters 400 of the trip planning engine 390 may be accessible via the TRU controller display or the mobile computing device 200 and/or sent directly to the mobile computing device 200. The output parameters 400 may also be displayed on a display interface on the controller 82 of the TRU 26. The output parameters 400 may include potential routes 402, the TRU predicted operation 404, and energy consumption 406. As mentioned above, the mobile computing device 200 may be a computing device such as a desktop computer. The mobile computing device 200 may also be a mobile computing device that is typically carried by a person, such as, for example a phone, PDA, smart watch, tablet, laptop, etc. The mobile computing device 200 may also be two separate devices that are synced together such as, for example, a cellular phone and a desktop computer synced over an internet connection.

The output parameters 400 may be displayed visually on a display screen 212 of the mobile computing device 200, as show in FIG. 5. The display screen 212 may give a user of the mobile computing device 200 real-time visibility to various data sources including perishable good parameters 389, TRU parameters 385, energy storage device parameters 382, potential routes 402, and route parameters 381. For example a user of the mobile computing device 200 may check the operation of the TRU 26 by selecting the TRU parameters 385. In another example, a user of the mobile computing device 200 may check the state of the energy storage device 62 by selecting energy storage device parameters 382. If the energy storage device 62 is a battery, then the energy storage device parameters 382 may include a state of charge of the battery system, a state of health of the battery system, and a battery remaining discharge time period. In another example, a user of the mobile computing device 200 may view and select potential routes 402 the by selecting the potential routes 402. Multiple potential routes 402 may be displayed concurrently on the display screen 212 for comparison and/or each potential route 402 may be displayed one at a time. An individual using the user device 200 may scroll through the potential routes 402. In another example, a user of the mobile computing device 200 may view route parameters 381 for each of the potential routes 402. As mentioned above, the route parameters 381 may include locations of recharging stations along each of the potentials routes 402 in order to recharge the energy storage device 62. The route parameters 381 may include locations of service stations along each of the potential routes 402 in order to service the TRU 26.

Figure 6:
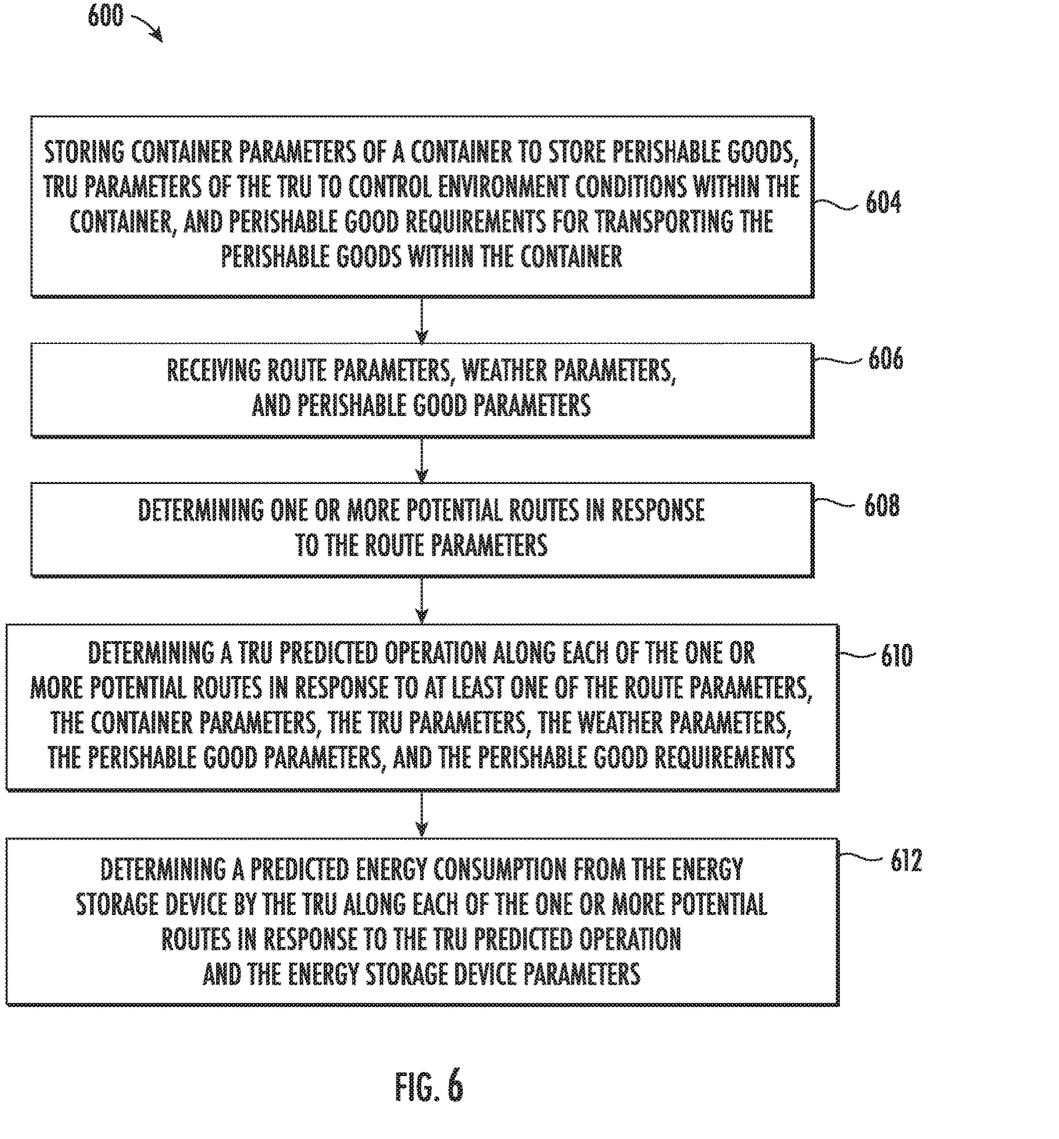
FIG. 6 is a flow diagram illustrating a method of determining potential routes for a transportation refrigeration unit powered by an electric energy storage device, according to an embodiment of the present disclosure.

Referring now also to FIG. 6 with continued reference to FIGS. 1-5. FIG. 6 shows a flow diagram illustrating a method 600 of determining potential routes 402 for a TRU 26 powered by an electric energy storage device 62, according to an embodiment of the present disclosure. At block 604, parameters of the trip planning system 300 are stored on a data storage device 380. The parameters stored may include container parameters 384 of a container 24 to store perishable goods, TRU parameters 385 of a TRU 26 to control environment conditions within the container 24, and perishable good requirements 288 for transporting the perishable goods within the container 24.

At block 606, additional parameters are received and then may be stored on the data storage device 380. The parameters received may include route parameters 381, weather parameters 386, and perishable good parameters 389. As described above, the route parameters 381 may include a starting location of the perishable goods and a destination location of the perishable goods. At block 608, one or more potential routes 402 may be determined in response to the route parameters 381.

At block 610, a TRU predicted operation 404 is determined along each of the one or more potential routes 402 in response to at least one of the route parameters 381, the container parameters 384, the TRU parameters 385, the weather parameters 386, the perishable good parameters 389, and the perishable good requirements 388. At block 612, a predicted energy consumption 406 from the energy storage device 62 by the TRU 26 along each of the one or more potential routes 402 in response to the TRU predicted operation 404 and the energy storage device parameters 382.

The method 600 may also include displaying each of the one or more potential routes 402 and the predicted energy consumption 406 from the energy storage device 62 by the TRU 26 for each of the one or more potential routes 402 on a mobile computing device 200. The method 600 may further include: determining predicted energy device storage parameters 382 along each of the one or more potential routes 402 in response to the TRU predicted operation 404 and the energy storage device parameters 382; and displaying the predicted energy device storage parameters 382 along each of the one or more potential routes 402 on a mobile computing device 200. Further, battery charging locations along each of the one or more potential routes may be displayed on at least one of the mobile computing device 200 and a display interface on the controller 82 of the TRU 26. The method 600 may further include: determining a battery remaining discharge time period in response to the predicted energy consumption 406; and determining whether the battery remaining discharge time period is longer than at least one of the one or more potential routes 402.

An alarm 259 may be activated on a mobile computing device 200 when a predicted energy consumption 406 from the energy storage device 62 by the TRU 26 is determined to exceed predicted energy device storage parameters 382 along one of the one or more potential routes 402 in response to the TRU predicted operation 404 and the energy storage device parameters 382. For example, if the energy storage device 62 is a battery, when the predicted energy consumption 406 exceeds the state of charge of a battery alone one of the one or more potential routes 402, then the alarm 259 will activated to alert the person (e.g. driver) with the mobile computing device 200.

While the above description has described the flow process of FIG. 6 in a particular order, it should be appreciated that unless otherwise specifically required in the attached claims that the ordering of the steps may be varied.

As described above, embodiments can be in the form of processor-implemented processes and devices for practicing those processes, such as a processor. Embodiments can also be in the form of computer program code containing instructions embodied in tangible media, such as network cloud storage, SD cards, flash drives, floppy diskettes, CD ROMs, hard drives, or any other computer-readable storage medium, wherein, when the computer program code is loaded into and executed by a computer, the computer becomes a device for practicing the embodiments. Embodiments can also be in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes a device for practicing the embodiments. When implemented on a general-purpose microprocessor, the computer program code segments configure the microprocessor to create specific logic circuits.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of determining potential routes for a transportation refrigeration unit (TRU) powered by an electric energy storage device, the method comprising:
storing container parameters of a container to store perishable goods, TRU parameters of the TRU to control environment conditions within the container, and perishable good requirements for transporting the perishable goods within the container;
receiving route parameters, weather parameters, and perishable good parameters;
determining one or more potential routes in response to the route parameters;
determining a TRU predicted operation along each of the one or more potential routes in response to at least one of the route parameters, the container parameters, the TRU parameters, the weather parameters, the perishable good parameters, and the perishable good requirements;
determining a predicted energy consumption from the energy storage device by the TRU along each of the one or more potential routes in response to the TRU predicted operation and the energy storage device parameters; and
displaying each of the one or more potential routes and the predicted energy consumption from the energy storage device by the TRU for each of the one or more potential routes on a mobile computing device.

2. The method of claim 1, wherein:
the energy storage device includes a battery system.

3. The method of claim 2, wherein:
the energy storage device parameters include at least one of a state of charge of the battery system, a state of health of the battery system and a battery remaining discharge time period.

4. The method of claim 2, further comprising:
determining a battery remaining discharge time period in response to the predicted energy consumption; and
determining whether the battery remaining discharge time period is longer than at least one of the one or more potential routes.

5. The method of claim 2, further comprising:
displaying each of the one or more potential routes and battery charging locations along each of the one or more potential routes on at least one of a mobile computing device and a display interface on the controller of the TRU.

6. The method of claim 1, further comprising:
determining predicted energy device storage parameters along each of the one or more potential routes in response to the TRU predicted operation and the energy storage device parameters; and
displaying the predicted energy device storage parameters along each of the one or more potential routes on a mobile computing device.

7. The method of claim 6, further comprising:
activating an alarm on a mobile computing device when a predicted energy consumption from the energy storage device by the TRU exceeds predicted energy device storage parameters along one of the one or more potential routes.

8. An engineless transport refrigeration unit (TRU) comprising:
a compressor constructed and arranged to compress a refrigerant;
a compressor motor configured to drive the compressor and operate at a voltage range of two hundred to six hundred volts;
an electric energy storage device for providing power to the compressor motor; and
a controller configured to control operation of the transport refrigeration unit, the controller comprising:
a processor; and
a memory comprising computer-executable instructions that, when executed by the processor, cause the processor to perform operations, the operations comprising:
storing container parameters of a container to store perishable goods, TRU parameters of the TRU to control environment conditions within the container, and perishable good requirements for transporting the perishable goods within the container;
receiving route parameters, weather parameters, and perishable good parameters;
determining one or more potential routes in response to the route parameters;

determining a TRU predicted operation along each of the one or more potential routes in response to at least one of the route parameters, the container parameters, the TRU parameters, the weather parameters, the perishable good parameters, and the perishable good requirements; and determining a predicted energy consumption from the energy storage device by the TRU along each of the one or more potential routes in response to the TRU predicted operation and the energy storage device parameters.

9. The TRU of claim 8, wherein the operations further comprise:
displaying each of the one or more potential routes and the predicted energy consumption from the energy storage device by the TRU for each of the one or more potential routes on a mobile computing device.

10. The TRU of claim 8, wherein:
the energy storage device includes a battery system.

11. The TRU of claim 10, wherein:
the energy storage device parameters include at least one of a state of charge of the battery system, a state of health of the battery system, and a battery remaining discharge time period.

12. The TRU of claim 10, wherein the operations further comprise:
determining a battery remaining discharge time period in response to the predicted energy consumption; and
determining whether the battery remaining discharge time period is longer than at least one of the one or more potential routes.

13. The TRU of claim 10, wherein the operations further comprise:
displaying each of the one or more potential routes and battery charging locations along each of the one or more potential routes on at least one of a mobile computing device and a display interface on the controller of the TRU.

14. The TRU of claim 8, wherein the operations further comprise:
determining predicted energy device storage parameters along each of the one or more potential routes in response to the TRU predicted operation and the energy storage device parameters; and
displaying the predicted energy device storage parameters along each of the one or more potential routes on a mobile computing device.

15. The TRU of claim 14, wherein the operations further comprise:
activating an alarm on a mobile computing device when a predicted energy consumption from the energy storage device by the TRU exceeds predicted energy device storage parameters along one of the one or more potential routes.

16. A system for determining potential routes for a transportation refrigeration unit (TRU) powered by an electric energy storage device, the system comprising:
a transportation refrigeration unit comprising:
a compressor constructed and arranged to compress a refrigerant;
a compressor motor configured to drive the compressor and operate at a voltage range of two hundred to six hundred volts;
an electric energy storage device for providing power to the compressor motor; and
a controller configured to control operation of the transport refrigeration unit; and a trip planning engine in electronic communication with the controller through a cloud network, the trip planning engine comprising:
a processor; and
a memory comprising computer-executable instructions that, when executed by the processor, cause the processor to perform operations, the operations comprising:
storing container parameters of a container to store perishable goods, TRU parameters of the TRU to control environment conditions within the container, and perishable good requirements for transporting the perishable goods within the container;
receiving route parameters, weather parameters, and perishable good parameters;
determining one or more potential routes in response to the route parameters;
determining a TRU predicted operation along each of the one or more potential routes in response to at least one of the route parameters, the container parameters, the TRU parameters, the weather parameters, the perishable good parameters, and the perishable good requirements; and
determining a predicted energy consumption from the energy storage device by the TRU along each of the one or more potential routes in response to the TRU predicted operation and the energy storage device parameters.

17. The system of claim 16, wherein the operations further comprise:
displaying each of the one or more potential routes and the predicted energy consumption from the energy storage device by the TRU for each of the one or more potential routes on a mobile computing device.

18. The system of claim 16, wherein:
the energy storage device includes a battery system.

19. The system of claim 18, wherein:
the energy storage device parameters include at least one of a state of charge of the battery system, a state of health of the battery system, and a battery remaining discharge time period.

20. A method of determining potential routes for a transportation refrigeration unit (TRU) powered by an electric energy storage device, the method comprising:
storing container parameters of a container to store perishable goods, TRU parameters of the TRU to control environment conditions within the container, and perishable good requirements for transporting the perishable goods within the container;
receiving route parameters, weather parameters, and perishable good parameters;
determining one or more potential routes in response to the route parameters;
determining a TRU predicted operation along each of the one or more potential routes in response to at least one of the route parameters, the container parameters, the TRU parameters, the weather parameters, the perishable good parameters, and the perishable good requirements;
determining a predicted energy consumption from the energy storage device by the TRU along each of the one or more potential routes in response to the TRU predicted operation and the energy storage device parameters;
determining predicted energy device storage parameters along each of the one or more potential routes in response to the TRU predicted operation and the energy storage device parameters; and displaying the predicted energy device storage parameters along each of the one or more potential routes on a mobile computing device.

21. A method of determining potential routes for a transportation refrigeration unit (TRU) powered by an electric energy storage device, the method comprising:

storing container parameters of a container to store perishable goods, TRU parameters of the TRU to control environment conditions within the container, and perishable good requirements for transporting the perishable goods within the container;

receiving route parameters, weather parameters, and perishable good parameters;

determining one or more potential routes in response to the route parameters;

determining a TRU predicted operation along each of the one or more potential routes in response to at least one of the route parameters, the container parameters, the TRU parameters, the weather parameters, the perishable good parameters, and the perishable good requirements;

determining a predicted energy consumption from the energy storage device by the TRU along each of the one or more potential routes in response to the TRU predicted operation and the energy storage device parameters, wherein the energy storage device includes a battery system;

determining a battery remaining discharge time period in response to the predicted energy consumption; and determining whether the battery remaining discharge time period is longer than at least one of the one or more potential routes.

22. A method of determining potential routes for a transportation refrigeration unit (TRU) powered by an electric energy storage device, the method comprising:

storing container parameters of a container to store perishable goods, TRU parameters of the TRU to control environment conditions within the container, and perishable good requirements for transporting the perishable goods within the container;

receiving route parameters, weather parameters, and perishable good parameters;

determining one or more potential routes in response to the route parameters;

determining a TRU predicted operation along each of the one or more potential routes in response to at least one of the route parameters, the container parameters, the TRU parameters, the weather parameters, the perishable good parameters, and the perishable good requirements;

determining a predicted energy consumption from the energy storage device by the TRU along each of the one or more potential routes in response to the TRU predicted operation and the energy storage device parameters, wherein the energy storage device includes a battery system; and displaying each of the one or more potential routes and battery charging locations along each of the one or more potential routes on at least one of a mobile computing device and a display interface on the controller of the TRU.

* * * * *